United States Patent
Shimoshige

(10) Patent No.: US 6,580,302 B2
(45) Date of Patent: Jun. 17, 2003

(54) SEMICONDUCTOR INTEGRATED CIRCUIT AND LAYOUT DESIGN METHOD THEREOF

(75) Inventor: Hirotaka Shimoshige, Yokohama (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/886,259

(22) Filed: Jun. 22, 2001

(65) Prior Publication Data

US 2002/0003243 A1 Jan. 10, 2002

(30) Foreign Application Priority Data

Jul. 6, 2000 (JP) ........................................ 2000-205423

(51) Int. Cl.[7] ................................................ H03K 5/13
(52) U.S. Cl. ........................ 327/259; 327/258; 327/291; 327/295; 327/172
(58) Field of Search ................................. 327/258, 259, 327/237, 239, 250–253, 291, 295, 296, 297, 172

(56) References Cited

U.S. PATENT DOCUMENTS

| | | | | |
|---|---|---|---|---|
| 4,417,158 A | * | 11/1983 | Ito et al. ...................... | 327/295 |
| 4,827,157 A | * | 5/1989 | Machida et al. ............. | 327/259 |
| 5,041,738 A | * | 8/1991 | Walters, Jr. .................. | 327/258 |
| 5,453,707 A | * | 9/1995 | Hiratsuka et al. ............ | 327/259 |
| 5,672,991 A | * | 9/1997 | Thoma et al. ............... | 327/258 |
| 5,874,845 A | * | 2/1999 | Hynes .......................... | 327/259 |
| 6,172,542 B1 | * | 1/2001 | Williams et al. ............. | 327/239 |
| 6,323,711 B2 | * | 11/2001 | Truong et al. ............... | 327/259 |

FOREIGN PATENT DOCUMENTS

JP 52-127051 10/1977

* cited by examiner

*Primary Examiner*—Tuan T. Lam
(74) *Attorney, Agent, or Firm*—Oblon, Spivak, McClelland, Maier & Neustadt, P.C.

(57) ABSTRACT

A semiconductor integrated circuit includes a clock signal source for generating two-phase clock signals having spacing periods, a two-phase clock wiring for transmitting the two-phase clock signals to a plurality of internal circuits constructing the integrated circuit, and a waveform correction circuit having a plurality of MOS transistors of the same conductivity type connected between the two-phase clock wiring and a preset potential node and constructed to attain spacing periods of the two-phase clock signals. The waveform correction circuit corrects the blunted portions of the two-phase clock signals to stably attain spacing periods, and when it is distributed and arranged in portions far apart from the clock signal source, a problem of racing and the like can be effectively suppressed.

14 Claims, 6 Drawing Sheets

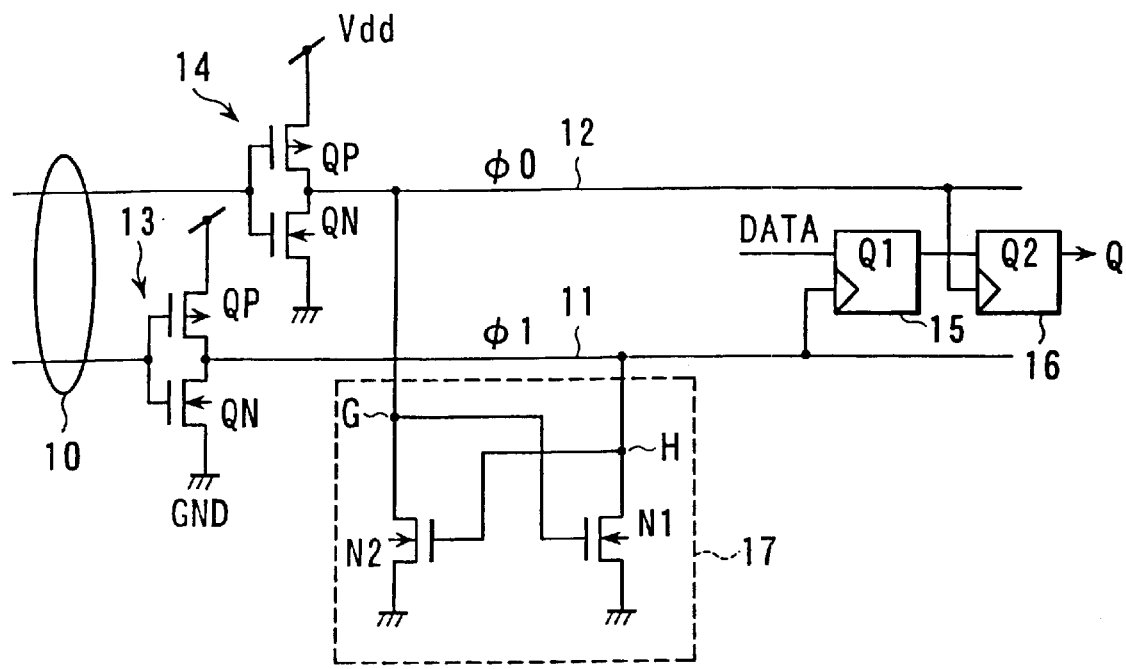
FIG. 5
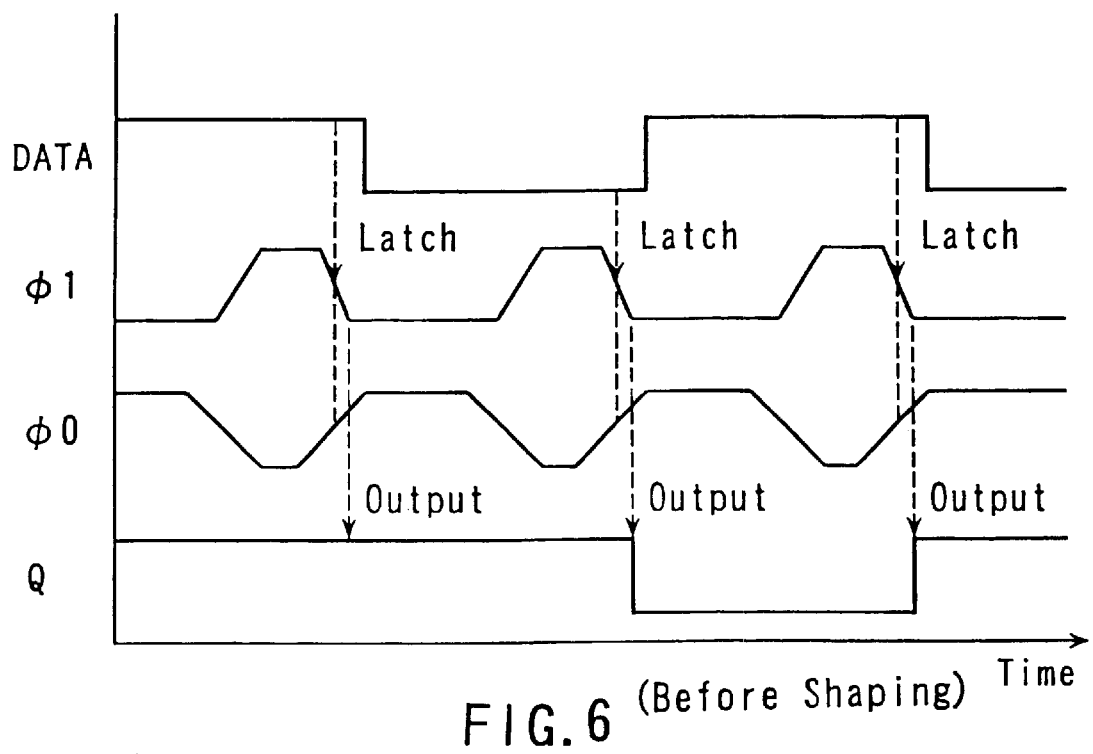
FIG. 6 (Before Shaping)

SEMICONDUCTOR INTEGRATED CIRCUIT AND LAYOUT DESIGN METHOD THEREOF

CROSS-REFERENCE TO RELATED APPLICATIONS

This application is based upon and claims the benefit of priority from the prior Japanese Patent Application No. 2000-205423, filed Jul. 6, 2000, the entire contents of which are incorporated herein by reference.

BACKGROUND OF THE INVENTION

This invention relates to a semiconductor integrated circuit and a layout design method thereof and more particularly to a waveform correction circuit used in a logic LSI, for example, for providing countermeasures against clock skew of two-phase clock wires.

Generally, in the logic LSI, the clock propagation delay of a clock wiring used for transmitting a clock signal supplied from a clock signal source to an internal circuit becomes larger as the load capacitance including the wiring capacitance and wiring resistance (which vary in proportion to the length of the wiring) and the terminal capacitance of an internal circuit element becomes larger. Therefore, a clock buffer circuit is inserted at a halfway portion of the wiring. In this case, in the two-phase clock wiring used for transmitting two-phase clock signals supplied from the two-phase clock signal source (clock driver circuit) to the internal circuit, a difference between the delay amounts of the two-phase clock signals becomes important.

FIG. 1 shows one example of a two-phase clock wiring system in the conventional logic LSI and internal circuits connected thereto.

In FIG. 1, reference numeral 10 denotes a two-phase clock wiring which includes a first clock wire 11 and second clock wire 12.

A first latch circuit 15 determines or holds input data supplied thereto via a data signal line in response to the falling edge of a first clock signal $\phi1$ from the first clock wire 11.

A second latch circuit 16 fetches data from an output node Q1 of the first latch circuit 15 in response to the rising edge of a second clock signal $\phi0$ from the second clock wire 12 and outputs latched data from an output node Q2.

FIG. 2 shows one example of waveforms of the clock signals $\phi1$, $\phi0$ of the two-phase clock wires 11, 12 shown in FIG. 1 and operation waveforms of the two cascade-connected latch circuits 15, 16. FIG. 3 shows an enlarged portion of the waveforms of the two-phase clock signals $\phi1$, $\phi0$ in FIG. 2.

As shown in FIGS. 2 and 3, the two-phase clock signals $\phi1$, $\phi0$ have waveforms each having a period "L" (low level) and a period "H" (high level) which are set in an approximately complementary relation, a period of the same level (spacing period) exists between the trailing edge of the high level portion of one of the signals and the leading edge of the high level portion of the other signal and a period of the same level (spacing period) also exists between the leading edge of the high level portion of the former signal and the trailing edge of the high level portion of the latter signal. In this example, a spacing period (between a broken line a–b and a broken line c–d) of "L" exists between the falling edge of $\phi1$ and the rising edge of $\phi0$ and a spacing period of "L" exists between the falling edge of $\phi0$ and the rising edge of $\phi1$. Thus, the latch operation and the output operation of the two latch circuits 15, 16 which are cascade-connected as described before are correctly effected.

For example, as shown in FIG. 4, there occurs a possibility that a period which is originally set as the spacing period of "L" will become a racing period (between a broken line e–f and a broken line g–h) in which the signals are set at "H" due to a difference between the blunted or rounded portion of the waveform of $\phi0$ and the blunted or rounded portion of the waveform of $\phi1$ in some cases. As the cause of a difference between the blunted portion of the waveform of $\phi0$ and the blunted portion of the waveform of $\phi1$, it is considered that the load of the first clock wire 11 and the load of the second clock wire 12 are made different by branching the first clock wire 11 on the input side of the first latch circuit 15 as indicated by broken lines in FIG. 1 and connecting the same to a different circuit 15a, for example. Further, the above difference may occur in a portion separated far apart from the clock generating source and connected thereto via a long clock wire in a semiconductor chip.

If the racing period thus occurs, the latch operation and the output operation of the two latch circuits 15, 16 which are cascade-connected as described before are not correctly effected in some cases. For example, if the waveform of $\phi1$ is blunted or rounded as indicated by broken lines in FIG. 2, data fetching timing in the first latch circuit 15 is deviated and the second latch circuit 16 will fetch erroneous latched data of the first latch circuit 15 and output erroneous data. The same operation occurs when the blunted or rounded portion of the waveform of $\phi0$ becomes different from the rounded portion of the waveform of $\phi1$.

That is, in a case wherein the two-phase clock wires 11, 12 are long, the wiring lengths thereof are different from each other (the resistances thereof are different) or the numbers of circuits such as latch circuits respectively supplied with the clock signals $\phi0$ and $\phi1$ are different (the capacitances thereof are different), then a difference between the loads for the $\phi0$ and $\phi1$ larger than expected occurs, the balance therebetween cannot be maintained, the timing relation between the falling edge and the rising edge of $\phi0$ and $\phi1$ is reversed, a spacing period of the two-phase clock signals $\phi0$ and $\phi1$ cannot be attained in portions of the paths of the two-phase clock wires 11, 12 and a racing period occurs. As a result, a period in which the first latch circuit 15 supplied with $\phi1$ as the clock input and the second latch circuit 16 supplied with $\phi0$ as the clock input as described before are both turned ON occurs and the latch operation and the output operation of the two cascade-connected latch circuits 15, 16 are not correctly effected.

Therefore, in the prior art, in order to prevent the predictable occurrence of a racing period, two-phase clock signals having a relatively long spacing period are generated from the two-phase clock signal source, but when a computer aided design (CAD) apparatus is used for LSI layout design, attention which is so delicate and adequate as in a case of manual design by a designer is not always given and there occurs a possibility that such a racing period as described above occurs in the circuit portion of a real product in which the spacing period is required.

BRIEF SUMMARY OF THE INVENTION

A semiconductor integrated circuit according to a first aspect of this invention comprises a clock signal source configured to generate two-phase clock signals having spacing periods; a two-phase clock wiring configured to transmit the two-phase clock signals to a plurality of internal circuits constructing the integrated circuit; and a waveform correction circuit having a plurality of MOS transistors of the same conductivity type which are connected between the two-phase clock wiring and a preset potential node and constructed to attain spacing periods of the two-phase clock signals.

A layout design method of a semiconductor integrated circuit according to a second aspect of this invention comprises the steps of arranging a plurality of circuit cells; arranging wires including two-phase clock wires; and distributing and arranging a plurality of MOS transistors for waveform correction connected between the two-phase clock wires and a preset potential node to attain spacing periods of the two-phase clock signals in spaces other than areas in which the plurality of circuit cells of an integrated circuit chip and the wires are arranged.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 5 is a circuit diagram showing one example of a two-phase clock wiring system and internal circuits connected thereto in a logic LSI according to a first embodiment of this invention;

FIG. 6 is a diagram showing one example of operation waveforms of two cascade-connected latch circuits in FIG. 5;

DETAILED DESCRIPTION OF THE INVENTION

Figure 1:
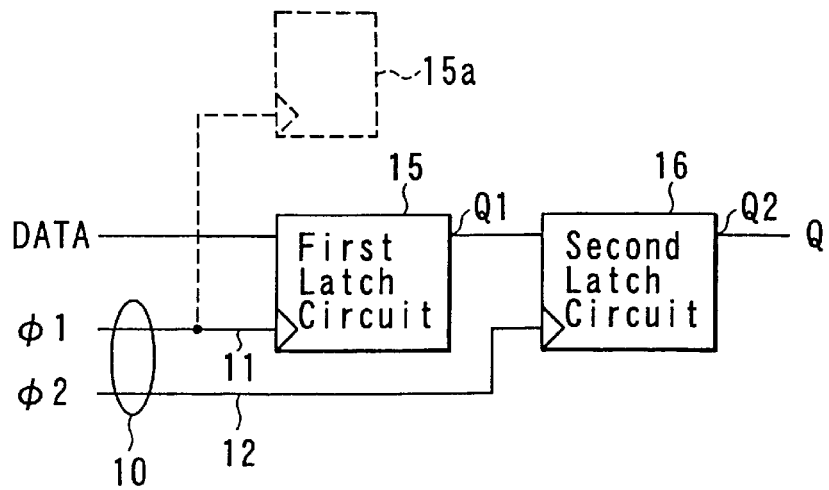
FIG. 1 is a circuit diagram showing one example of a two-phase clock wiring system of the conventional logic LSI and internal circuits connected thereto.
Figure 2:
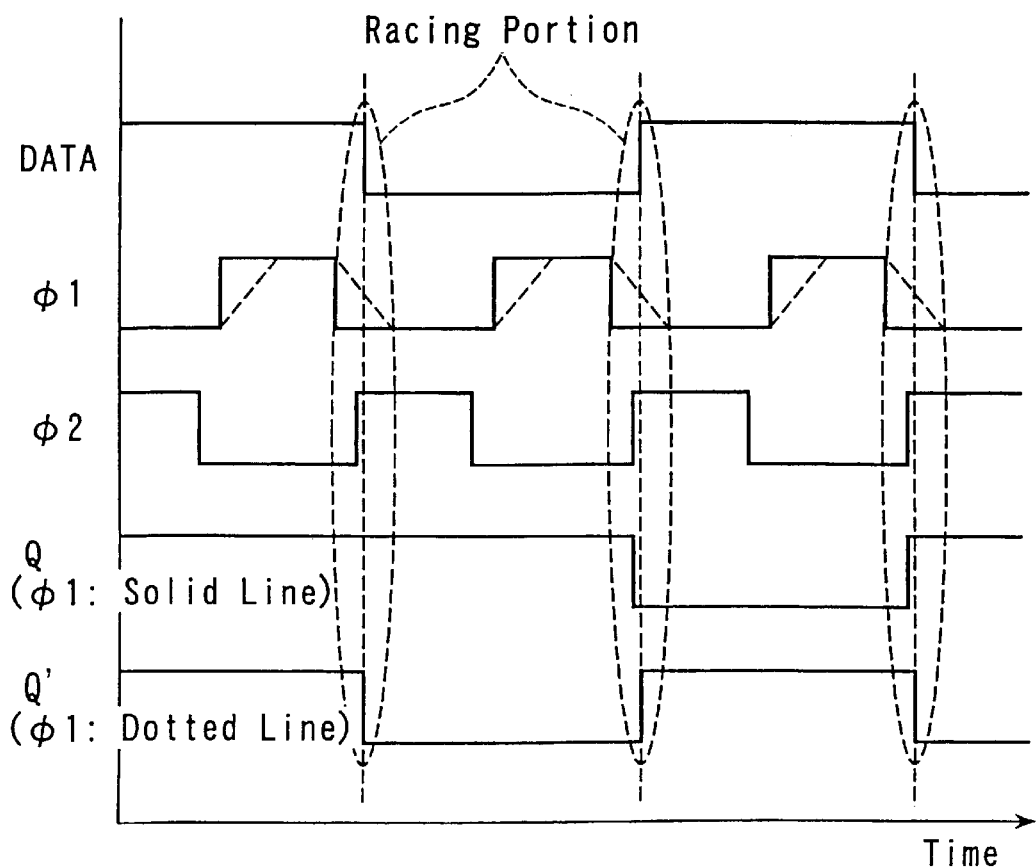
FIG. 2 is a diagram showing one example of waveforms of two-phase clock signals of two-phase clock wires in FIG. 1 and operation waveforms of two cascade-connected latch circuits.

There will now be described embodiments of this invention with reference to the accompanying drawings.
First Embodiment FIG. 5 shows one example of a two-phase clock wiring system and internal circuits connected thereto in a logic LSI according to a first embodiment of this invention.

In FIG. 5, reference numeral 10 denotes a two-phase clock wiring including a first clock wire 11 and second clock wire 12. Reference numeral 13 denotes a first clock buffer circuit inserted into the first clock wire 11 and reference numeral 14 denotes a second clock buffer circuit inserted into the second clock wire 12.

The clock buffer circuits 13 and 14 each include a PMOS transistor QP and NMOS transistor QN which are serially connected between a power supply node (Vdd node) and a ground node (GND node), the gates of the MOS transistors are commonly connected to an input node and the drains thereof are commonly connected to an output node.

The first latch circuit 15 determines or holds input data DATA in response to the falling edge of a first clock signal $\phi 1$ supplied via the first clock wire 11.

The second latch circuit 16 fetches data from an output node Q1 of the first latch circuit 15 in response to the rising edge of a second clock signal $\phi 0$ supplied via the first clock wire 12 and outputs latched data from an output node Q2.

A waveform correction circuit 17 is located on the preceding stage side with respect to the first latch circuit 15 and second latch circuit 16 and includes a plurality of transistors connected between the two-phase clock wires 11, 12 and the GND node to attain spacing periods of the two-phase clock signals $\phi 1$, $\phi 0$.

The waveform correction circuit in the first embodiment includes a first NMOS transistor N1 whose drain-source path is connected between the first clock wire 11 and the GND node and a second NMOS transistor N2 whose drain-source path is connected between the second clock wire 12 and the GND node and whose gate and drain are respectively connected to the drain and gate of the first transistor N1.

Figure 3:
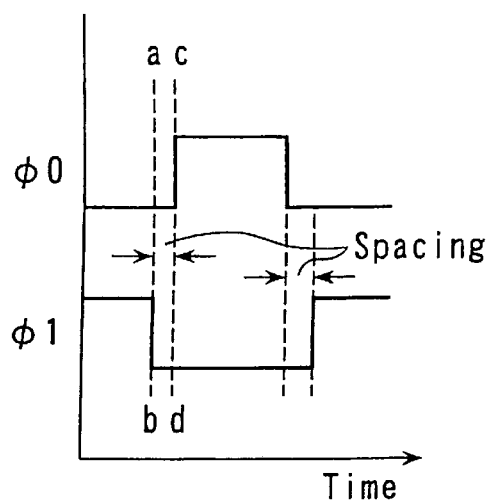
FIG. 3 is a diagram showing a portion of the waveforms of the two-phase clock signals in FIG. 2, for illustrating spacing periods.
Figure 4:
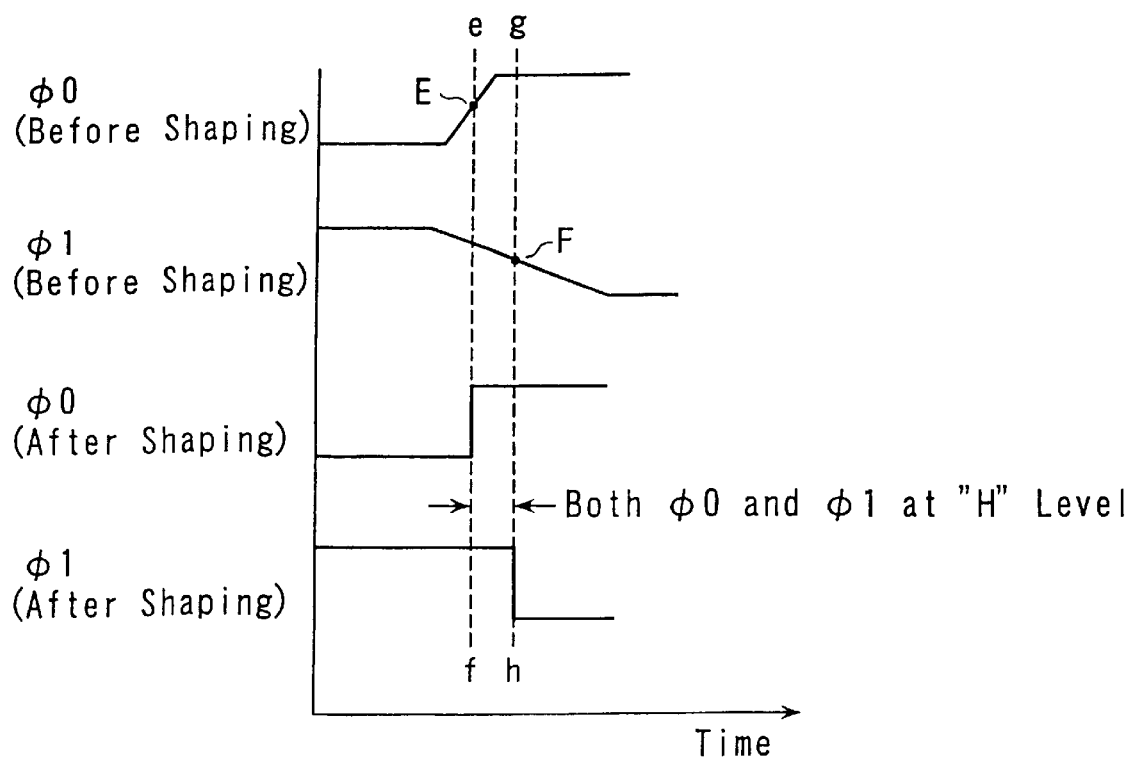
FIG. 4 is a waveform diagram showing the state in which a racing period occurs due to a difference between blunted portions of the waveforms of the two-phase clock signals.

The operation of the circuit with the above construction is now explained. In this case, it is preferred that the desired spacing periods exist in the two-phase clock signal 10 input to the first clock buffer 13 and second clock buffer 14 from the clock signal source. That is, as explained with reference to FIG. 3, for example, it is desirable that a spacing period (between the broken line a–b and broken line c–d) of "L" exists between the falling edge of $\phi 1$ and the rising edge of $\phi 0$ and a spacing period of "L" exists between the falling edge of $\phi 0$ and the rising edge of $\phi 1$.

However, if the circuits are located far apart from the clock signal source, the waveforms of the two-phase clock signals $\phi 1$, $\phi 0$ are blunted or rounded as shown in FIG. 6. FIG. 6 shows the operation waveforms of respective portions (DATA, $\phi 1$, $\phi 0$ Q2) of the two cascade-connected latch circuits 15, 16 in FIG. 5. Even if the two-phase clock signals $\phi 1$, $\phi 0$ are thus blunted, the latch circuit 16 can output a signal which is originally expected as shown by Q in response to an input signal DATA to the latch circuit 15 by use of the circuit construction of FIG. 5.

Figure 7:
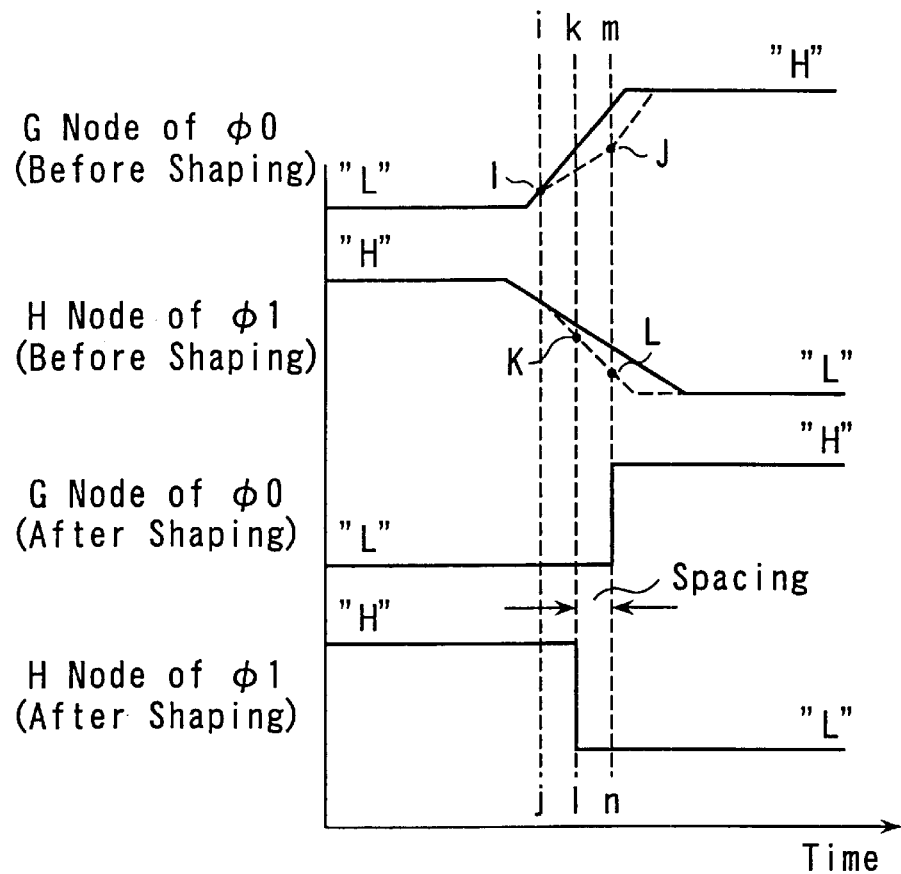
FIG. 7 is a timing chart for illustrating the operation of a waveform correction circuit by taking a case wherein the blunted degree of the waveform at the falling edge of $\phi 1$ is larger than the blunted degree of the waveform at the rising edge of $\phi 0$ as one example in which the blunted degrees of the waveforms of the two-phase clock signals at an H node and G node in FIG. 5 are different from each other.

FIG. 7 is a timing chart showing the waveforms of the two-phase clock signals φ1, φ0 at the H node and G node of FIG. 5, for illustrating the operation of the waveform correction circuit 17. In this case, an example wherein the blunted degree of the waveform of the falling edge of φ1 is larger than the blunted degree of the waveform of the falling edge of φ0 is shown as one example of cases wherein the blunted degrees of the waveforms output from the clock buffers 13, 14 are different from each other.

Now, attention is paid to a case wherein the clock signal input φ1 to the first clock buffer circuit 13 changes from "H" to "L" at the first clock wire 11 and the clock signal input φ0 to the second clock buffer circuit 14 changes from "L" to "H" at the second clock wire 12.

In the process in which the clock signal output φ0 of the second clock buffer circuit 14 changes from "L" to "H", the transistor N1 is turned ON when the clock signal exceeds the threshold voltage (I point) of the transistor N1 (broken line i–j), and the falling edge of the clock signal output φ1 from the first clock buffer circuit 13 falls at a higher speed as shown by the waveform indicated by a broken line. At this time point, since the PMOS transistor QP of the first clock buffer circuit 13 is already set in the OFF state, it does not obstruct the operation of the falling edge of φ1 which falls at the higher speed, as previously described.

At this time, since the clock signal output φ1 from the first clock buffer circuit 13 is still set at "H" and the transistor N2 is not yet completely set into the OFF state in the system of the first clock wire 11, the rising edge of the clock signal output φ0 from the second clock buffer circuit 14 rises at a lower speed, as shown by the waveform indicated by a broken line.

In the process in which the clock signal output φ1 from the first clock buffer circuit 13 changes from the "H" level to the "L" level via a K point of the threshold voltage of the circuit, the transistor N2 is turned OFF when the threshold voltage (L point) of the transistor N2 is exceeded (a broken line m–n), and the rising edge of the clock signal output φ0 from the second clock buffer circuit 14 rises at a higher speed as indicated by a broken line after paint J. At this time point, since the NMOS transistor QN of the second clock buffer circuit 14 is already set in the OFF state, it does not obstruct the operation of the rising edge of φ0 which rises at a higher speed, as previously described.

If the waveform correction process is effected as indicated by the broken lines, waveforms after passing through wave-shaping circuits contained in the first and second latch circuits or the like will become the originally expected waveforms having a spacing period as shown in the lower half portion of FIG. 7.

Thus, the spacing period (between the broken line k–l and the broken line m–n) can be stably attained between the falling edge of the clock signal output φ1 from the first clock buffer circuit 13 and the rising edge of the clock signal output φ0 from the second clock buffer circuit 14 by use of the waveform correction circuit 17 and an occurrence of the racing period can be prevented.

If occurrence of the racing period can be thus prevented, the latch operation and output operation of the two cascade-connected latch circuits 15, 16 can be correctly effected, as previously described, and Q shown in FIG. 6 can be output.

By maintaining the balance between the characteristics of the NMOS transistors N1 and N2, the same operation as described above can also be attained between the falling edge of the clock signal output φ0 from the second clock buffer circuit 14 and the rising edge of the clock signal output φ1 from the first clock buffer circuit 13 and an occurrence of the racing period can be prevented.

Therefore, for example, if the two-stage latch circuits 15, 16 are used on the master side and different two-stage latch circuits (not shown) are provided on the slave side, then the latch operation can be correctly performed in response to the falling edge of φ0 and the output operation can be correctly performed in response to the rising edge of φ1 with respect to the different two-stage latch circuits.

If the waveform correction circuit 17 is arranged in a portion such as the end portion of the two-phase clock wires 11, 12 in which the largest time constant is expected, the effect of the present invention becomes larger, but it is preferable to locate the waveform correction circuit on the preceding stage side with respect to the internal circuit (such as the latch circuits 15, 16) which requires the spacing periods of the two-phase clock signals φ1, φ0. In this case, it is possible to distribute and arrange the NMOS transistors N1, N2 for waveform correction in a plurality of portions including a portion located on the preceding stage side of the internal circuit in the integrated circuit chip.

Figure 8:
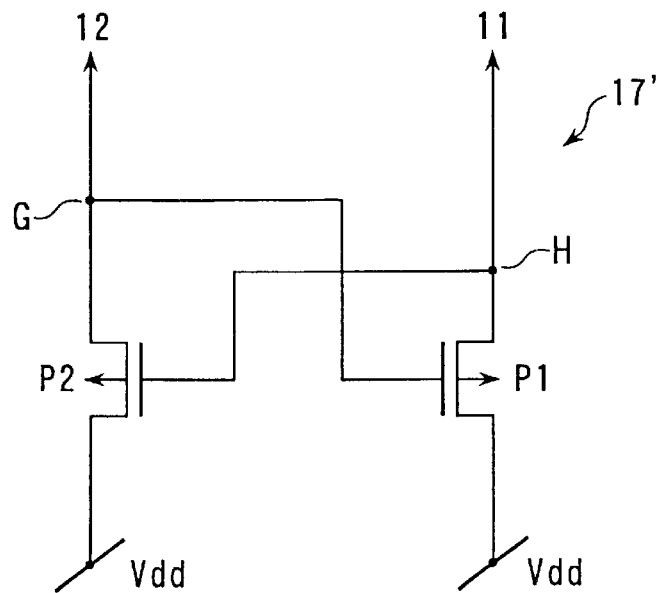
FIG. 8 is a circuit diagram showing one example of the waveform correction circuit used in a low-active logic circuit in the first embodiment.

In FIG. 5, a case wherein the waveform correction circuit 17 constructed by a plurality of NMOS transistors is used in the high-active logic circuit to make the waveform of the falling edge of the clock signal sharp and make the waveform of the rising edge gentle is shown. However, in a case wherein the waveform of the rising edge of the clock signal is made sharp and the waveform of the falling edge is made gentle in the low-active logic circuit, it is possible to use a waveform correction circuit 17' which corresponds to the waveform correction circuit 17 and is constructed by a plurality of PMOS transistors connected between the two-phase clock wires 11, 12 and the Vdd node as shown in FIG. 8.

Second Embodiment

It is sometimes desired to fixedly keep both of the two-phase clock signals φ1, φ0 at "H" in a portion of the internal circuit so as to reduce the power consumption in the integrated circuit chip. In this case, in the circuit of the first embodiment, the NMOS transistors N1 and N2 tend to lower the potentials of the two-phase clock wires 11, 12, that is, to prevent φ1, φ0 from being fixed at "H". The second embodiment improves on this point.

Figure 9:
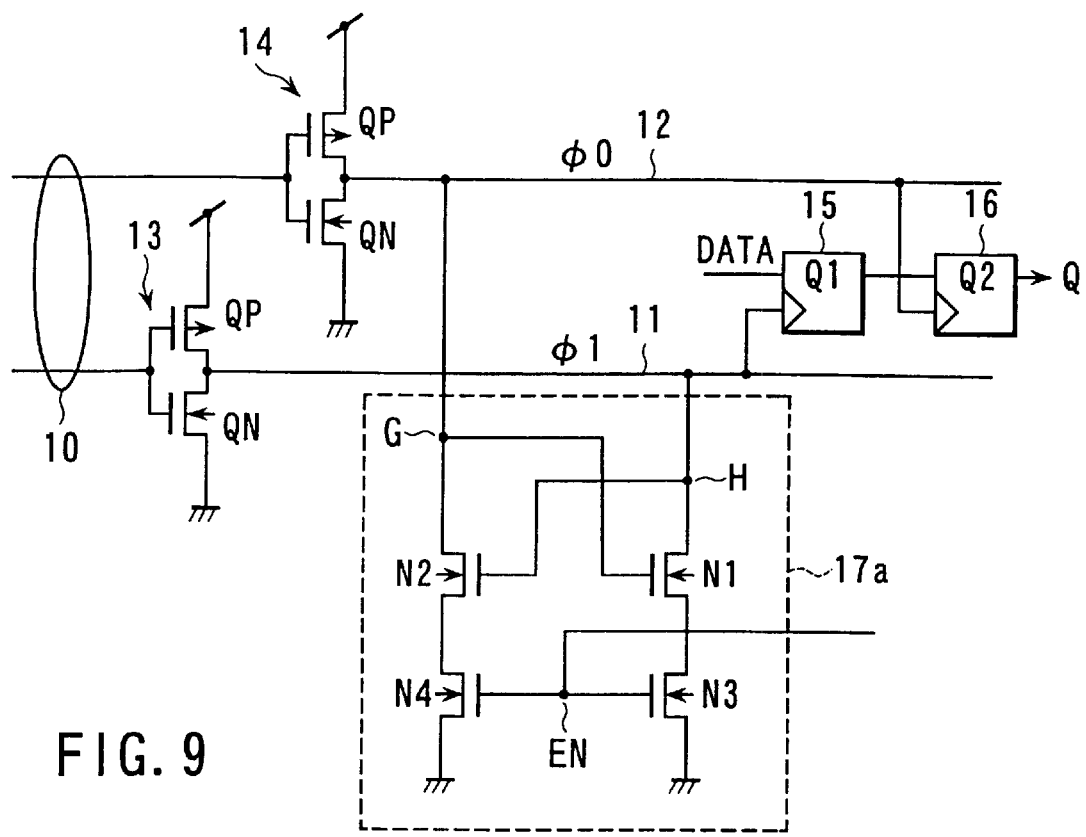
FIG. 9 is a circuit diagram showing one example of a two-phase clock wiring system and internal circuits connected thereto in a logic LSI according to a second embodiment of this invention.

FIG. 9 shows one example of a two-phase clock wiring system and internal circuits connected thereto in a logic LSI according to the second embodiment of this invention.

The circuit shown in FIG. 9 is similar to that of FIG. 5 except for the waveform correction circuit 17a. Portions which are the same as those of FIG. 5 are denoted by the same reference numerals.

The waveform correction circuit 17a includes a third NMOS transistor N3 whose drain-source path is connected in series with the NMOS transistor N1 between the first clock wire 11 and the GND node and whose gate is supplied with an enable control signal EN to control the ON/OFF state thereof, and a fourth NMOS transistor N4 whose drain-source path is connected in series with the NMOS transistor N2 between the second clock wire 12 and the GND node and whose gate is supplied with the enable control signal EN to control the ON/OFF state thereof, in addition to the waveform correction circuit 17 of the first embodiment.

With the above construction, when the signal EN is set at "H", the NMOS transistors N3, N4 are set in the ON state and the NMOS transistors N1 and N2 can perform the same operation as in the first embodiment.

On the other hand, if the signal EN is set at "L" when it is required to fix φ1, φ0 at "H", the NMOS transistors N3, N4 are set in the OFF state to cut off the power supplies on the source sides of the NMOS transistors N1 and N2, and therefore, it becomes possible to prevent the NMOS transistors N1 and N2 from lowering the potentials of the two-phase clock wires 11, 12.

Figure 10:
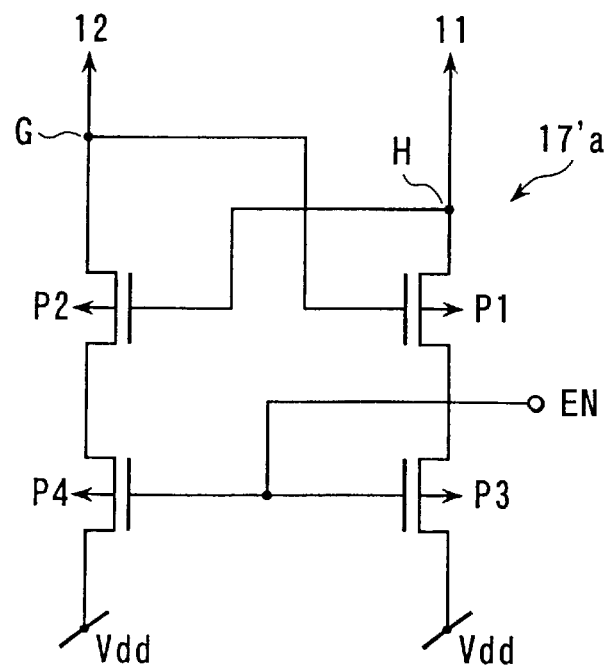
FIG. 10 is a circuit diagram showing one example of a waveform correction circuit used in a low-active logic circuit in the second embodiment.

In the second embodiment, a case wherein the waveform correction circuit 17a constructed by a plurality of NMOS transistors is used in the high-active logic circuit to make the waveform of the falling edge of the clock signal sharp and make the waveform of the rising edge gentle is shown. However, in a case wherein the waveform of the rising edge of the clock signal is made sharp and the waveform of the falling edge is made gentle in the low-active logic circuit, it is possible to use a waveform correction circuit 17a' which corresponds to the waveform correction circuit 17a and is constructed by a plurality of PMOS transistors connected between the two-phase clock wires 11, 12 and the Vdd node as shown in FIG. 10.

Third Embodiment

In the third embodiment, a layout design method for distributing and arranging a group of MOS transistors for waveform correction in a plurality of portions in the integrated circuit chip is explained.

Figure 11A:
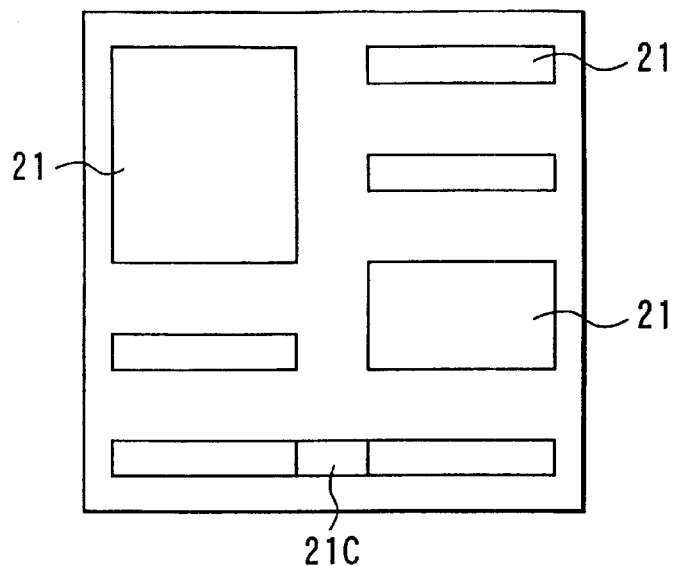
FIGS. 11A to 11C are schematic layout views (plan views) of an integrated circuit chip, for illustrating an integrated circuit layout design method according to a third embodiment of this invention in a stepwise fashion.
Figure 11B:
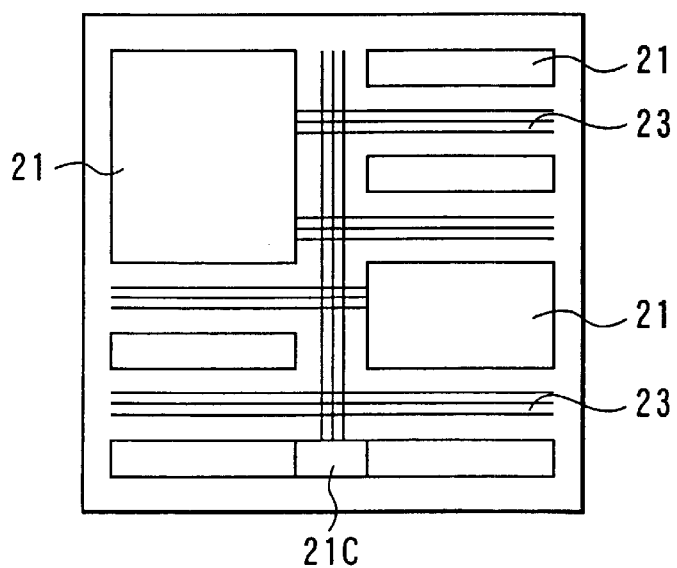
Figure 11C:
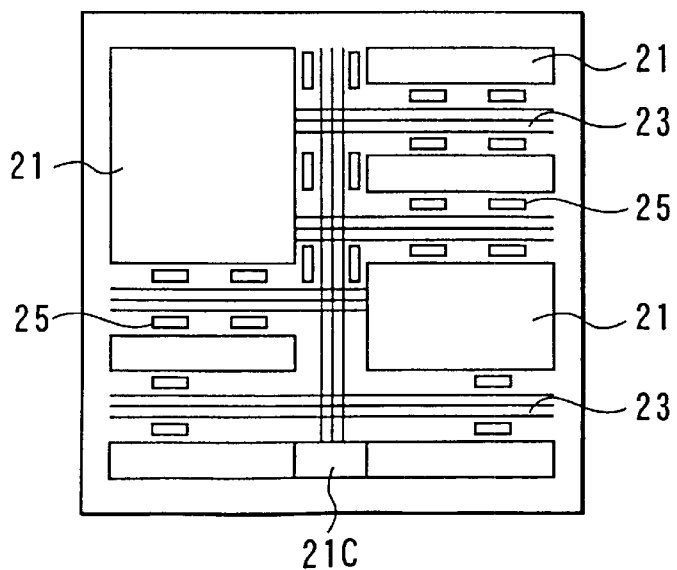

FIGS. 11A to 11C are schematic layout views of a chip, for illustrating the integrated circuit layout design method according to the third embodiment of this invention in a stepwise fashion.

In the process of the layout design of a semi-conductor integrated circuit having two-phase clock wires for transmitting two-phase clock signals having spacing periods to internal circuits of the integrated circuit, first, a plurality of cells 21 which are provided as circuit elements are arranged according to the design rules (FIG. 11A) and then wires 23 including the two-phase clock wires are arranged (FIG. 11B). Generally, the above steps are automatically performed by use of a computer, but a plurality of space areas in which neither the cells 21 nor the wires 23 are arranged exist.

As the next step, waveform correction circuits 25 which are connected between the two-phase clock wires contained in the wires 23 and a GND line contained in the wires 23 to stably attain spacing periods of the two-phase clock signals are distributed and arranged in the space areas which are located far apart from a clock signal source 21c (FIG. 11C). An increase in the chip area (size) can be suppressed to a minimum by utilizing the space areas.

As described above, according to this invention, it is possible to provide a semi-conductor integrated circuit and a layout design method thereof in which the possibility of occurrence of racing in a circuit portion in which spacing periods of the two-phase clock signals are required can be prevented and the operation of two-stage latch circuits supplied with the two-phase clock signals can be correctly performed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit comprising:
   a clock signal source configured to generate two-phase clock signals including a first pulse signal and a second pulse signal which are approximately complementary to each other, a pulse width of the first pulse signal at a complimentary portion is larger than a pulse width of the second pulse signal at the complimentary portion, an edge of the first pulse signal trailing from a high level to a low level precedes an edge of the second pulse signal leading from the low level to the high level, and a succeeding edge of the second pulse signal trailing from the high level to the low level precedes a succeeding edge of the first pulse signal leading from the low level to the high level, and said two-phase clock signals having spacing periods in which the first pulse signal and the second pulse signal set at the same potential level are provided before and after each pulse of the second pulse signal;
   a two-phase clock wiring configured to transmit the two-phase clock signals to a plurality of internal circuits constructing the integrated circuit; and
   a waveform correction circuit having a plurality of MOS transistors of the same conductivity type connected between the two-phase clock wiring and a preset potential node and configured to secure the spacing periods of the two-phase clock signals.

2. The semi-conductor integrated circuit according to claim 1, wherein a plurality of waveform correction circuits each of which is constructed by the waveform correction circuit are distributed and arranged in one chip.

3. The semi-conductor integrated circuit according to claim 1, wherein the waveform correction circuit is located in a preceding stage of one of said plurality of internal circuits which requires the spacing periods.

4. A semiconductor integrated circuit comprising:
   a clock signal source configured to generate two-phase clock signals including a first pulse signal and a second pulse signal which are approximately complementary to each other, a pulse width of the first pulse signal at a complimentary portion is larger than a pulse width of the second pulse signal at the complimentary portion, an edge of the first pulse signal trailing from a high level to a low level precedes an edge of the second pulse signal leading from the low level to the high level, and a succeeding edge of the second pulse signal trailing from the high level to the low level precedes a succeeding edge of the first pulse signal leading from the low level to the high level, and said two-phase clock signals having spacing periods in which the first pulse signal and the second pulse signal set at the same potential level are provided before and after each pulse of second pulse signal;
   a two-phase clock wiring configured to transmit the two-phase clock signals to a plurality of internal circuits constructing the integrated circuit; and
   a waveform correction circuit having a first MOS transistor and a second MOS transistor and configured to secure the spacing periods of the two-phase clock signals;
   wherein the first MOS transistor has a first gate, a first source and a first drain, a path between the first drain and the first source is connected between a first clock wire of the two-phase clock wiring and a preset potential node, the second MOS transistor has a second gate, a second source and a second drain, a path between the second drain and the second source is connected between a second clock wire of the two-phase clock wiring and a preset potential node, the second gate is connected to the first drain and the second drain is connected to the first gate.

5. The semi-conductor integrated circuit according to claim 4, wherein a plurality of waveform correction circuits each of which is constructed by the waveform correction circuit are distributed and arranged in one chip.

6. The semi-conductor integrated circuit according to claim 4, wherein the first MOS transistor and the second MOS transistor are n-type MOS transistors and the preset potential node is a ground potential node.

7. The semi-conductor integrated circuit according to claim 4, wherein the first MOS transistor and the second MOS transistor are p-type MOS transistors and the preset potential node is a power supply potential node.

8. The semi-conductor integrated circuit according to claim 4, wherein the waveform correction circuit is located in a preceding stage of one of the plurality of internal circuits which requires the spacing periods.

9. A semiconductor integrated circuit comprising:

a clock signal source configured to generate two-phase clock signals having spacing periods;

a two-phase clock wiring configured to transmit the two-phase clock signals to a plurality of internal circuits constructing the integrated circuit; and a waveform correction circuit having a first to a fourth MOS transistor;

wherein the first MOS transistor has a first gate, a first source and a first drain, the first drain is connected to a first clock wire of the two-phase clock wiring, the second MOS transistor has a second gate, a second source and a second drain, the second drain is connected to a second clock wire of the two-phase clock wiring, the second gate is connected to the first drain, the second drain is connected to the first gate, the third MOS transistor has a third gate, a third source and a third drain, the third drain is connected to the first source, the third source is connected to a preset potential node, the third gate is supplied with an enable control signal, the fourth MOS transistor has a fourth gate, a fourth source and a fourth drain, the fourth drain is connected to the second source, the fourth source is connected to the present potential node, and the fourth gate is supplied with the enable control signal.

10. The semiconductor integrated circuit according to claim 9, wherein the two-phase clock signals contain a first pulse signal and a second pules which are approximately complementary to each other, a pulse width of the first pulse signal at a complimentary portion is larger than a pulse width of the second pulse signal at the complimentary portion, an edge of the first pulse signal trailing from a high level to a low level precedes an edge of the second pulse signal leading from the low level to the high level a succeeding edge of the second pulse signal trailing from the high level to the high level precedes a succeeding edge of the first pulse signal leading from the low level to the high level, and the spacing periods in which the first pulse signal and the second pulse signal are set at the same potential level are provided before and after each pulse of the second pulse signal.

11. The semi-conductor integrated circuit according to claim 9, wherein a plurality of waveform correction circuits each of which is constructed by the waveform correction circuit are distributed and arranged in one chip.

12. The semi-conductor integrated circuit according to claim 9, wherein the first to the fourth MOS transistor are n-type MOS transistors and the preset potential node is a ground potential node.

13. The semi-conductor integrated circuit according to claim 9, wherein the first to the fourth MOS transistor are p-type MOS transistors and the preset potential node is a power supply potential node.

14. The semi-conductor integrated circuit according to claim 9, wherein the waveform correction circuit is located in a preceding stage of one of the plurality of internal circuits which requires the spacing periods.

* * * * *